United States Patent
Usami

(10) Patent No.: US 9,885,829 B2
(45) Date of Patent: Feb. 6, 2018

(54) SEMICONDUCTOR DEVICE AND METHOD OF MANUFACTURING THE SAME

(71) Applicant: Renesas Electronics Corporation, Koutou-ku, Tokyo (JP)

(72) Inventor: Tatsuya Usami, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/174,981

(22) Filed: Jun. 6, 2016

(65) Prior Publication Data
US 2016/0370542 A1 Dec. 22, 2016

(30) Foreign Application Priority Data

Jun. 17, 2015 (JP) .................................. 2015-121692

(51) Int. Cl.
*G02B 6/13* (2006.01)
*G02B 6/122* (2006.01)
(Continued)

(52) U.S. Cl.
CPC ............... *G02B 6/13* (2013.01); *G02B 6/122* (2013.01); *G02B 6/12004* (2013.01); *G02B 6/1223* (2013.01); *G02B 6/132* (2013.01); *G02F 1/0121* (2013.01); *G02F 1/025* (2013.01); *G02B 6/43* (2013.01); *G02B 2006/12038* (2013.01); *G02B 2006/12061* (2013.01);
(Continued)

(58) Field of Classification Search
CPC ..................... G02B 2006/12061; G02B 6/122; G02B 6/13; G02B 6/12004; G02B 2006/12038; G02B 6/1223; G02B 6/43; G02B 6/132; H01L 31/02327; H01L 31/02325; H01L 31/18; G02F 1/025; G02F 2202/104; G02F 1/0121
See application file for complete search history.

(56) References Cited

U.S. PATENT DOCUMENTS 5,917,231 A * 6/1999 Kasai .................. H01L 23/4821
257/633
9,082,639 B2 * 7/2015 Mishima ............... H01L 27/088
(Continued)

FOREIGN PATENT DOCUMENTS

JP 07-074328 A 3/1995
JP 2000-031252 A 1/2000

*Primary Examiner* — Bac Au
(74) *Attorney, Agent, or Firm* — Shapiro, Gabor and Rosenberger, PLLC

(57) ABSTRACT

An SOI substrate is attracted to and detached from an electrostatic chuck included in a semiconductor manufacturing device without failures. A semiconductor device includes a semiconductor substrate made of silicon, a first insulating film formed on a main surface of the semiconductor substrate and configured to generate compression stress to silicon, a waveguide, made of silicon, formed on the first insulating film, and a first interlayer insulating film formed on the first insulating film so as to cover the waveguide. Further, a second insulating film configured to generate tensile stress to silicon is formed on the first interlayer insulating film and in a region distant from the optical waveguide by a thickness of the first insulating film or larger. The second insulating film offsets the compression of the first insulating film.

4 Claims, 11 Drawing Sheets

(51) Int. Cl.
  G02F 1/025 (2006.01)
  G02F 1/01 (2006.01)
  G02B 6/132 (2006.01)
  G02B 6/12 (2006.01)
  G02B 6/43 (2006.01)
  H01L 31/0232 (2014.01)
  H01L 31/18 (2006.01)

(52) U.S. Cl.
  CPC .. *G02F 2202/104* (2013.01); *H01L 31/02325* (2013.01); *H01L 31/02327* (2013.01); *H01L 31/18* (2013.01)

(56) References Cited

U.S. PATENT DOCUMENTS

| | | | |
|---|---|---|---|
| 9,508,662 B2* | 11/2016 | Kunishima | H01L 23/60 |
| 9,696,489 B2* | 7/2017 | Watanuki | G02B 6/122 |
| 2002/0136481 A1* | 9/2002 | Mule' | G02B 6/10 |
| | | | 385/14 |
| 2013/0037902 A1* | 2/2013 | Nakazawa | H01L 27/14623 |
| | | | 257/432 |
| 2013/0202005 A1* | 8/2013 | Dutt | H01L 29/165 |
| | | | 372/50.1 |
| 2014/0369642 A1* | 12/2014 | Yanagisawa | G02B 6/12002 |
| | | | 385/14 |
| 2015/0349015 A1* | 12/2015 | Yamaguchi | H01L 27/14645 |
| | | | 257/432 |
| 2015/0349018 A1* | 12/2015 | Takami | H01L 27/14685 |
| | | | 438/69 |
| 2017/0031094 A1* | 2/2017 | Nakashiba | G02B 6/122 |
| 2017/0031095 A1* | 2/2017 | Nakashiba | G02B 6/122 |
| 2017/0038530 A1* | 2/2017 | Inada | G02B 6/122 |
| 2017/0045683 A1* | 2/2017 | Usami | G02B 6/122 |
| 2017/0069769 A1* | 3/2017 | Usami | H01L 31/02327 |
| 2017/0077161 A1* | 3/2017 | Suzuki | H01L 27/14625 |
| 2017/0082877 A1* | 3/2017 | Arimoto | G02F 1/025 |

\* cited by examiner

SEMICONDUCTOR DEVICE AND METHOD OF MANUFACTURING THE SAME

CROSS-REFERENCE TO RELATED APPLICATION

The present application claims priority from Japanese Patent Application No. 2015-121692 filed on Jun. 17, 2015, the content of which is hereby incorporated by reference into this application.

TECHNICAL FIELD

The present invention relates to a semiconductor device and a method of manufacturing the semiconductor device. For example, the present invention is suitably used for a semiconductor device using an SOI (silicon on insulator) substrate and manufacturing the semiconductor device.

BACKGROUND ART

Japanese Patent Application Laid-Open Publication No. H7(1995)-74328 (Patent Document 1) describes a technique of directly bonding a first semiconductor substrate as an SOI layer and a second semiconductor substrate as a support substrate by firmly attaching them in a clean atmosphere. Forming a groove in an oxide film of the first semiconductor substrate as an SOI layer can reduce warpage of an SOI substrate.

Japanese Patent Application Laid-Open Publication No. 2000-31252 (Patent Document 2) describes a technique of detecting a thickness of a wafer rear-surface oxide film prior to treatment of the wafer, and applying a series of voltage sequence (detachment sequence) thereto according to the thickness. By application of the detachment sequence, a wafer detachment is smoothly performed.

SUMMARY OF THE INVENTION

In a semiconductor manufacturing device, one of the methods used for attracting and holding a wafer is an electrostatic chuck. The electrostatic chuck is capable of attracting a whole surface of the wafer. Particularly, the electrostatic chuck is used as a method of holding a large-diameter wafer. However, in the case of a wafer including an SOI substrate (hereinafter, referred to as SOI wafer) having a rear-surface insulating film, residual attracting force of the electrostatic chuck is not reduced due to charges remained in the SOI wafer. As a result, the SOI wafer is sometimes attached to the electrostatic chuck. For this reason, failures such as cracking or conveyance failure of the SOI wafer may occur when the SOI wafer is detached from the electrostatic chuck.

The above and other problems and novel characteristics of the present invention will be apparent from the description of the present specification and the accompanying drawings.

A semiconductor device according to an embodiment of the present invention includes: a substrate made of silicon; a first clad layer formed on a main surface of the substrate and configured to generate compression stress to silicon; an optical waveguide, made of silicon, formed on the first clad layer; and a second clad layer formed on the first clad layer so as to cover the optical waveguide. Then, an insulating film configured to generate tensile stress to silicon is formed on the second clad layer, and in a region distant from the optical waveguide by a thickness of the first clad layer or larger.

In addition, a method of manufacturing a semiconductor device according to an embodiment includes the step of preparing an SOI substrate including: a substrate made of silicon; a first clad layer formed on a first main surface of the substrate and configured to generate compression force to silicon; a silicon layer formed on the first clad layer; and a rear-surface clad layer formed on a second main surface opposite to the first main surface of the substrate and configured to generate compression stress to silicon. The method further includes the steps of forming an optical waveguide made of the silicon layer by processing the silicon layer; forming a second clad layer on the first clad layer so as to cover the optical waveguide; forming an insulating film, configured to generate tensile stress to silicon, on the second clad layer; removing the rear-surface clad layer after forming the insulating film; and removing the insulating film positioned above the optical waveguide. Then, in the step of removing the insulating film, the insulating film is removed so as to have a distance between the optical waveguide and the insulating film by a thickness of the first clad layer or larger.

According to an embodiment of the present invention, an SOI wafer can be attracted to and detached from an electrostatic chuck included in a semiconductor manufacturing device without failures.

BRIEF DESCRIPTIONS OF THE DRAWINGS

DETAILED DESCRIPTION OF PREFERRED EMBODIMENTS

Figure 1:
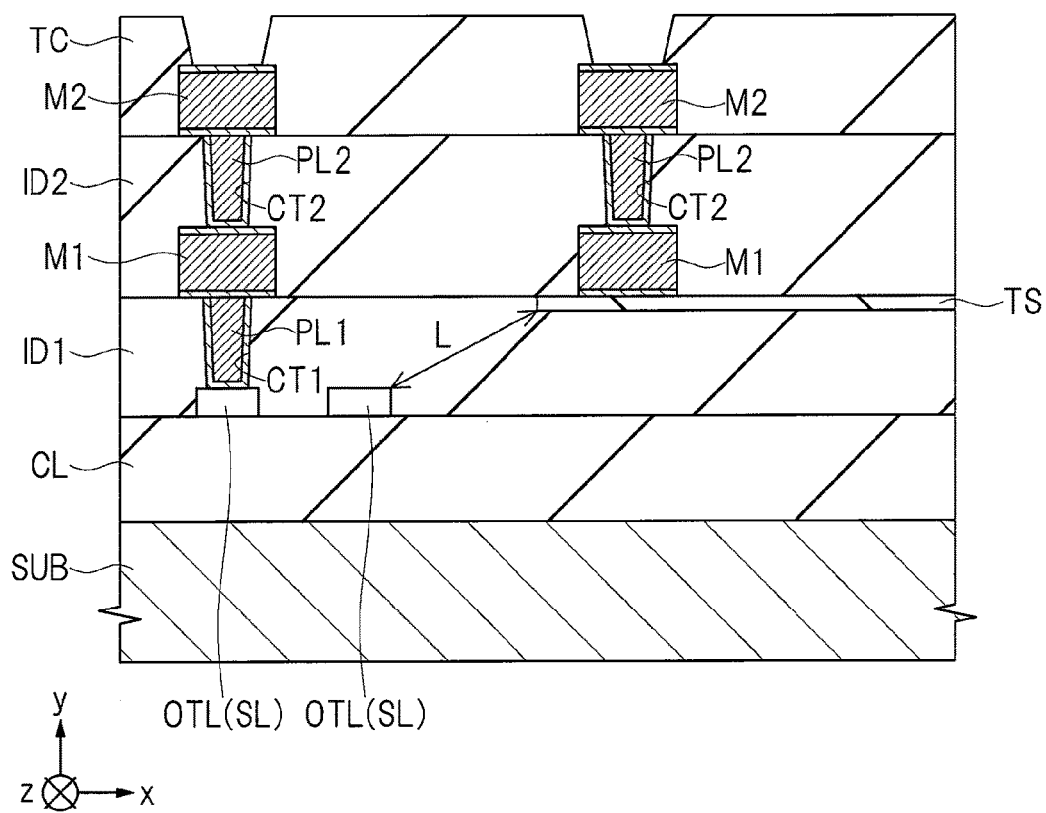
FIG. 1 is a cross-sectional view of main parts of a semiconductor device according to a first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Further, it is needless to say that such phrases as "formed of A", "made of A", "comprising A", "including A", "having A" do not eliminate other elements than A unless otherwise stated that the element is limited to that. Similarly, in the embodiments described below, when the shape of the components, positional relation thereof, and the like are mentioned, the substantially approximate or similar shapes and the like are included therein unless otherwise stated or except the case where it is conceivable that they are apparently excluded in principle. The same goes for the numerical value and the range described above.

In addition, in the following embodiments, silicon nitride includes $Si_3N_4$ as a stoichiometric composition, but also includes an insulating film of silicon nitride having a similar composition.

Further, in the following embodiments, the term "compression stress" means force for generating compression stress to a semiconductor substrate, made of single crystal silicon (Si), including an SOI wafer. Also, the term "tensile stress" means force for generating tensile stress to a semiconductor substrate, made of single crystal silicon, including an SOI wafer. For example, in the case of forming an insulating film on a main surface of a silicon wafer, if the compression stress is generated to the silicon wafer, the silicon wafer is warped such that the main surface on which the insulating film is formed has a convex shape. In the same example, if tensile stress is generated to the silicon wafer, the silicon wafer is warped such that the main surface on which the insulating film is formed has a concave shape.

Moreover, components having the same function will be denoted by the same reference symbols throughout the drawings for describing the embodiments, and a repetitive description thereof will be omitted. Hereinafter, embodiments of the present invention will be described in detail with reference to the accompanying drawings.

First Embodiment

In recent years, developments for realizing a technique of an optical-communication module have been aggressively carried out by manufacturing optical signal transmission lines using silicon as their material, and then integrating various optical devices and electronic devices that use an optical circuit including the optical signal transmission lines as a platform. Such a technique is known as a silicon photonics technique.

Hereinafter, the structure of a semiconductor device and a method of manufacturing the semiconductor device, using a silicon photonics technique, according to the first embodiment will be described. The first embodiment will exemplify a semiconductor device including an optical-signal waveguide unit that is integrated on an SOI substrate, but the present embodiment is not limited to this example. In addition, the first embodiment will exemplify a semiconductor device including a multi-layer wiring having a two-layer structure, but the present embodiment is not limited to this example.

<Structure of Semiconductor Device>

The structure of the semiconductor device according to the first embodiment will be described with reference to FIG. 1. FIG. 1 is a cross-sectional view of main parts of the semiconductor device according to the first embodiment.

As illustrated in FIG. 1, an optical-signal waveguide (also referred to as optical waveguide, transmission line, optical-signal line) OTL is formed in the semiconductor device. The waveguide OTL includes a semiconductor layer SL (also referred to as SOI layer) made of silicon (Si), and formed on a first main surface (also referred to as "surface") of a semiconductor substrate SUB made of single-crystal silicon (Si) interposing a first insulating film CL (also referred to as BOX layer, lower clad layer, and first clad layer) therebetween.

The first insulating film CL is made of silicon oxide ($SiO_2$) having material quality whose compression stress is higher than silicon (Si). The first insulating film CL has a thickness of about 1 μm or larger, and more preferably about 2 μm. In this manner, since the first insulating film is formed to have a relatively large thickness, capacitance between the semiconductor substrate SUB and the semiconductor layer SL can be suppressed to be small. In addition, propagation loss of light in the waveguide OTL can be prevented. A thickness of the semiconductor layer SL is considered to be suitable in a range of 100 to 300 nm (it is needless to say that the thickness is not limited to this range, depending on other conditions) and a range of 200 nm as a center value is considered to be the most preferable.

Here, as an example of the waveguide OTL, a rectangular optical waveguide will be described. However, the waveguide OTL is not limited to this shape, and may be a rib-type optical waveguide, for example. Note that the rectangular optical waveguide means a waveguide having a rectangle-shaped cross section that is orthogonal to a travelling direction of light. In addition, the rib-type optical waveguide means a waveguide having a convex-shaped cross section that is orthogonal to a travelling direction of light, and is structured to have a convex portion, having an effect of confining light travelling in a longitudinal direction, in a plate surface.

The semiconductor layer SL forming the waveguide OTL is processed to be in a plate shape and extends in a vertical direction in FIG. 1 (z-direction illustrated in FIG. 1). Thus, optical signals guided into the waveguide OTL travel in the vertical direction in FIG. 1. A height of the waveguide OTL (dimension in the vertical direction in FIG. 1 (y-direction illustrated in FIG. 1)) is a thickness of the semiconductor layer SL and the thickness thereof is about 100 to 300 nm, for example. Impurities are introduced into the waveguide OTL and a concentration of the impurities is in a range of, for example, $10^{15}$ to $10^{19}$ cm$^{-3}$ and a typical value of the concentration is, for example, about $10^{15}$ cm$^{-3}$.

The waveguide OTL is covered by a first interlayer insulating film ID1 (also referred to as upper-layer clad layer and second clad layer). The first interlayer insulating film ID1 is made of, for example, silicon oxide (SiO$_2$) and has a thickness of, for example, 1 μm or larger, and more preferably about 2 μm. On the first interlayer insulating film ID1, a second insulating film TS having material quality whose tensile stress is higher than silicon (Si) is formed. The second insulating film TS is a silicon nitride (Si$_3$N$_4$) film or the like, having a hydrogen content of, for example, 1% or lower. The second insulating film TS is formed by, for example, LPCVD (low pressure chemical vapor deposition) method or plasma CVD (plasma chemical vapor deposition) method. A thickness of the second insulating film TS is, for example, about 100 to 200 nm.

The second insulating film TS is not formed immediately above or on the waveguide OTL, but formed in a region having a predetermined distance from the waveguide OTL, that is, in the region having a distance of, for example, 2 μm or larger therefrom. Note that, in the following description, a distance between the waveguide OTL and the second insulating film TS means a shortest distance L between the waveguide OTL and the second insulating film TS, unless otherwise clearly stated.

In the first embodiment, while the distance between the waveguide OTL and the second insulating film TS is set to 2 μm or larger, this distance is determined based on a thickness of the first insulating film CL. In other words, the first insulating film CL is set to have a thickness that does not affect the semiconductor substrate SUB made of single crystal silicon (Si) in propagation of light in the waveguide OTL. Thus, by setting the distance between the waveguide OTL and the second insulating film TS to be larger than the thickness of the first insulating film CL, the second insulating film TS is made not to affect propagation of light in the waveguide OTL. Accordingly, since a preferable thickness of the first insulating film CL is set to, for example, about 2 μm in the first embodiment, the distance between the waveguide OTL and the second insulating film TS is set to be 2 μm or larger. However, the distance between the waveguide OTL and the second insulating film TS may be equal to or larger than the thickness of the first insulating film CL.

A wiring M1 of a first layer is formed on the first interlayer insulating film ID1. The wiring M1 of the first layer is made of a main conductive material consisting of, for example, aluminum (Al), copper (Cu) or an aluminum-copper alloy (Al—Cu alloy) and a barrier metal formed on a lower surface and an upper surface of the main conductive material. The barrier metal is provided for preventing diffusion of the metal as the main conductive material of the wiring M1 of the first layer. The barrier metal is made of, for example, tantalum (Ta), titanium (Ti), tantalum nitride (TaN) or titanium nitride (TiN) etc. A thickness of the barrier metal is, for example, about 5 to 20 nm.

A first connection hole (also referred to as contact hole) CT1 reaching to the waveguide OTL is formed in the first interlayer insulating film ID1. Inside the first connection hole CT1, a first plug PL1 (also referred to as embedded electrode and embedded contact) whose a main conductive material is tungsten (W) is formed through a barrier metal. The barrier metal is provided for preventing diffusion of the metal as the main conductive material of the first plug PL1. The barrier metal is made of, for example, titanium (Ti) or titanium nitride (TiN) etc. A thickness of the barrier film is, for example, about 5 to 20 nm. The waveguide OTL and the wiring M1 of the first layer are electrically connected with each other via the first plug PL1.

The wiring M1 of the first layer is covered by a second interlayer insulating film ID2. The second interlayer insulating film ID2 is made of, for example, silicon oxide (SiO$_2$) and has a thickness of, for example, about 1 μm or larger.

A wiring M2 of a second layer is formed on the second interlayer insulating film ID2. The wiring M2 of the second layer is made of a main conductive material consisting of, for example, aluminum (Al), copper (Cu) or an aluminum-copper alloy (Al—Cu alloy) and a barrier metal formed on a lower surface and an upper surface of the main conductive material, in the same manner as the wiring M1 of the first layer. The barrier metal is provided for preventing diffusion of the metal as the main conductive material of the wiring M2 of the second layer. The barrier metal is made of, for example, tantalum (Ta), titanium (Ti), tantalum nitride (TaN) or titanium nitride (TiN) etc. A thickness of the barrier metal is, for example, about 5 to 20 nm.

A second connection hole (also referred to as via hole) CT2 reaching to the wiring M1 of the first layer is formed in the second interlayer insulating film ID2. Inside the second connection hole CT2, a second plug PL2 (also referred to as embedded electrode and embedded contact) whoso a main conductive material is tungsten (W) is formed through a barrier metal. In the same manner as the first plug PL1, the barrier metal is provided for preventing diffusion of the metal as the main conductive material of the second plug PL2. The barrier metal is made of, for example, titanium (Ti) or titanium nitride (TiN) etc. A thickness of the barrier film is, for example, about 5 to 20 nm. The wiring M1 of the first layer and the wiring M2 of the second layer are electrically connected with each other via the second plug PL2.

The wiring M2 of the second layer is covered by a protective film TC, part of has which has an opening part to expose an upper layer of the wiring M2 of the second layer from the opening part. The protective film TC is made of, for example, a silicon nitride (SiON) film, a phosphor silicate glass (PSG) film or silicon nitride (Si$_3$N$_4$) film etc.

<Characteristics and Effects in Structure of Semiconductor Device>

In an existing SOI wafer, it is necessary to form an insulating film on a second main surface (also referred to as rear surface) that is opposite to a first main surface of a semiconductor substrate SUB so as to prevent warpage of the SOI wafer. However, such an SOI wafer having the rear surface on which the insulating film is formed has a larger residual attracting force of an electrostatic chuck, as compared to an SOI wafer not having the insulating film on the rear surface. While the residual attracting force can be reduced when an insulating film is not formed on the rear surface of the SOI wafer, but warpage of the SOI wafer may occur due to compression stress of the first insulating film CL and thus failures such as unintentional moving or conveyance failure of the SOI wafer may occur on the electrostatic chuck.

However, according to the semiconductor device of the first embodiment, the insulating film on the rear surface of the SOI wafer is removed before treating the SOI wafer in a semiconductor manufacturing device including an electrostatic chuck. Thus, even when a semiconductor manufacturing device including an electrostatic chuck is used, it is possible to release charges from the SOI wafer easily. In this manner, the charges are hardly accumulated on the rear surface of the SOI wafer and thus attachment of the SOI wafer to the electrostatic chuck can be avoided as the residual attracting force of the electrostatic chuck is reduced. Note that details of the mechanism will be described later in the description of a method of manufacturing the semiconductor device.

Note that, in this case, warpage of the SOI wafer is problematic. However, since the second insulating film TS having tensile stress is formed on the first interlayer insulating film ID1, the compression stress of the first insulating film CL is alleviated, so that the warpage of the SOI wafer can be reduced. In this manner, failures such as unintentional moving on the SOI wafer or conveyance failure of the SOI wafer due to warpage of the SOI wafer can be avoided.

Meanwhile, in order to offset the compression stress of the first insulating film CL by the tensile stress of the second insulating film TS, it is preferable to form the second insulating film TS on the whole surface of the semiconductor substrate SUB. However, in a case where the first insulating film CL and the first interlayer insulating film ID1 are made of silicon oxide ($SiO_2$) and the second insulating film TS is made of silicon nitride ($Si_3N_4$), a propagation loss of light in the waveguide OTL increases when the second insulating film TS is closer to the waveguide OTL, thereby causing a problem. That problem is caused by a difference in a refractive index between silicon oxide ($SiO_2$) having a refractive index of about 1.45 and silicon nitride ($Si_3N_4$) having a refractive index of about 2.00. Thus, it is required to form the second insulating film TS in a region that does not affect propagation of light in the waveguide OTL.

Accordingly, in the first embodiment, as described above, the second insulating film TS is not formed immediately above or on the waveguide OTL, but formed in a region having a distance of 2 µm or larger from the waveguide OTL. This arrangement of the second insulating film TS is effective when the thickness of the first interlayer insulating film ID1 is smaller than that of the first insulating film CL. Note that the region in which the waveguide OTL is formed is about 1% to 2% of the semiconductor device in a plan view. Thus, it is possible to cover about 90% of the region of the semiconductor device in a plan view by the second insulating film TS, even considering the sufficient arrangement.

On the other hand, when the thickness of the first interlayer insulating film ID1 on the waveguide OTL is larger than that of the first insulating film CL, the second insulating film TS can be formed on the whole surface on the first interlayer insulating film ID1.

Figure 2:
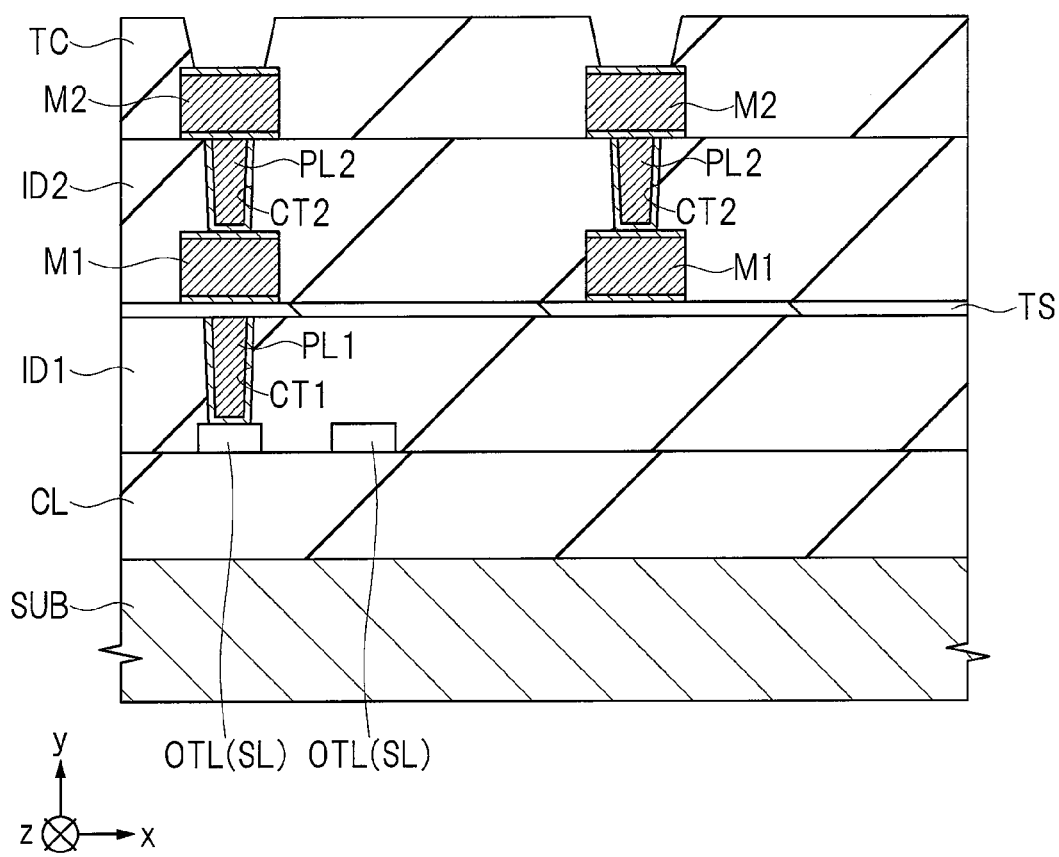
FIG. 2 is a cross-sectional view of main parts of the semiconductor device according to a first modification example of the first embodiment.

FIG. 2 is a cross-sectional view of main parts of the semiconductor device according to a first modification example of the first embodiment.

The first interlayer insulating film ID1 is formed so as to have a thickness of the first interlayer insulating film ID1 on the waveguide OTL larger than that of the first insulating film CL, and the second insulating film TS is formed on the whole surface on the first interlayer insulating film ID1. A thickness of the second insulating film TS is, for example, about 100 to 200 nm. In this manner, the compression stress of the first insulating film CL can be offset by the tensile stress of the second insulating film TS.

<Method of Manufacturing Semiconductor Device>

A method of manufacturing the semiconductor device according to the first embodiment will be described in order of steps with reference to FIGS. 3 to 10. FIGS. 3 to 10 are cross-sectional views of main parts illustrating manufacturing steps of the semiconductor device according to the first embodiment.

Figure 3:
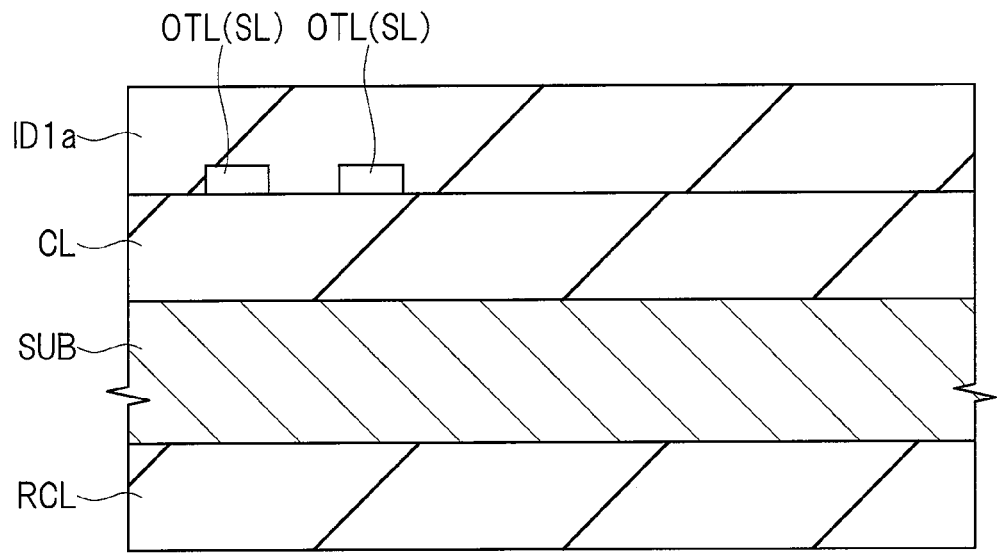
FIG. 3 is a cross-sectional view of main parts illustrating a manufacturing step of the semiconductor device according to the first embodiment.

As illustrated in FIG. 3, first, an SOI substrate (at this stage, a substrate having a planar and substantially circular shape called SOI wafer) is prepared. The SOI substrate includes the semiconductor substrate SUB, the first insulating film CL formed on the first main surface of the semiconductor substrate SUB, the semiconductor layer SL formed on the first insulating film CL, and a first rear-surface insulating film RCL formed on the second main surface opposite to the first main surface of the semiconductor substrate SUB.

The semiconductor substrate SUB is a support substrate made of single crystal silicon (Si). The first insulating film CL and the first rear-surface insulating film RCL are made of silicon oxide ($SiO_2$). The semiconductor layer SL is made of silicon (Si). A thickness of the semiconductor substrate SUB is, for example, about 750 µm. Thicknesses of the first insulating film CL and the first rear-surface insulating film RCL are, for example, 1 µm or larger, and more preferably about 2 µm. The first insulating film CL and the first rear-surface insulating film RCL have compression stress. A thickness of the semiconductor layer SL is, for example, about 100 to 300 nm, and more preferably about 200 nm.

The SOI substrate can be formed by a SIMOX (silicon implanted oxide) method, a sticking method or a smart-cut method etc. In the SIMOX method, oxide is ion-injected into a main surface of a semiconductor substrate made of, for example, silicon (Si) with high energy, and silicon (Si) and oxygen (O) are bonded through a thermal processing thereafter to form an insulating film, thereby forming an SOI substrate. In the sticking method, one semiconductor substrate made of silicon (Si) having an insulating film formed on, for example, the upper surface and the other semiconductor substrate made of silicon (Si) are adhered and stuck together by applying a high temperature and pressure to them, and then one of the semiconductor substrates is thinned by polishing, thereby forming an SOI substrate. In the smart-cut method, after insulating film is formed an on a main surface of one semiconductor substrate made of, for example, silicon (Si), hydrogen is ion-injected thereinto to be bonded with the other semiconductor substrate made of silicon (Si). Then, one of the semiconductor substrates is peeled off through a thermal processing by means of hydrogen embrittlement phenomenon, thereby forming an SOI substrate.

Next, by dry etching using a resist pattern formed on the semiconductor layer SL as a mask, impurities are introduced into the rectangular semiconductor layer SL after the semiconductor layer SL is processed to have a rectangular shape. A concentration of the impurities is in a range of, for example, $10^{15}$ to $10^{19}$ $cm^{-3}$ and a typical value of the concentration is, for example, about $10^{15}$ $cm^{-3}$. According to the steps described above, the waveguide OTL is formed.

Next, a lower-layer insulating film ID1a is formed on the first insulating film CL so as to cover the waveguide OTL. The lower-layer insulating film ID1a is made of silicon oxide ($SiO_2$) formed by, for example, a plasma CVD method, and has a thickness of, for example, about 2 μm. Then, an upper surface of the lower-layer insulating film. ID1a is planarized by, for example, a CMP (chemical mechanical polishing) method.

Figure 4:
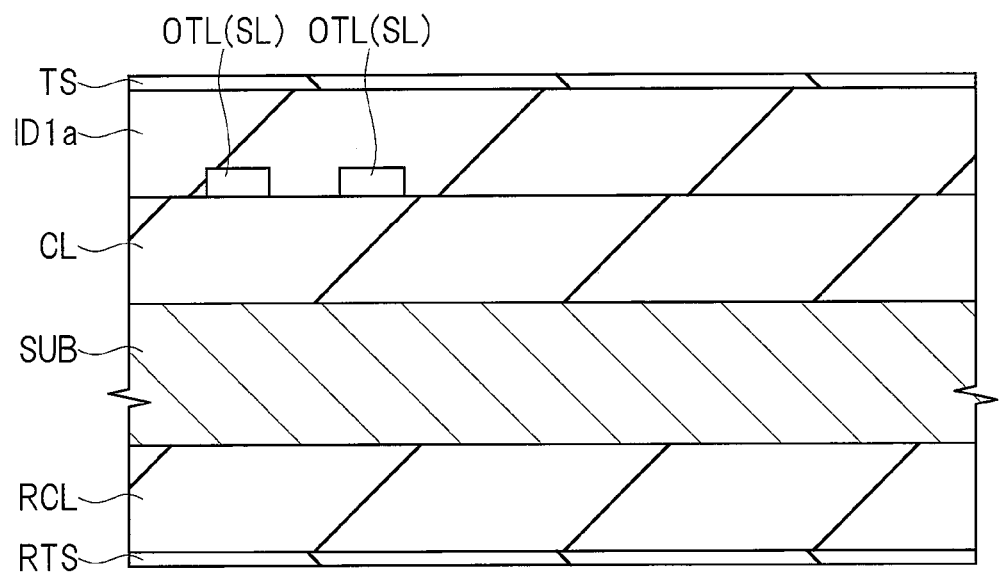
FIG. 4 is a cross-sectional view of main parts illustrating a manufacturing step of the semiconductor device continued from FIG. 3.

Next, as illustrated in FIG. 4, the second insulating film TS and a second rear-surface insulating film RTS each made of silicon nitride ($Si_3N_4$) are formed on the lower-layer insulating film ID1a and the first rear-surface insulating film RCL, respectively, by LPCVD method, for example. Thicknesses of the second insulating film TS and the second rear-surface insulating film RTS are, for example, about 100 to 200 nm.

Hydrogen contents of the second insulating film TS and the second rear-surface insulating film RTS are equal to or lower than 1%, and both of the second insulating film TS and the second rear-surface insulating film have tensile stress. It is possible to confirm through secondary ion mass spectrometry (SIMS), x-ray photoelectron spectroscopy (XPS) or Fourier transform infrared spectroscopy (FTIR) etc. that silicon nitride ($Si_3N_4$) is formed by LPCVD method.

Although a silicon nitride ($Si_3N_4$) film formed by LPCVD method has been exemplified as the second insulating film TS and the second rear-surface insulating film RTS each having tensile stress in this embodiment, the present embodiment is not limited to this example. Instead of using LPCVD method, silicon nitride ($Si_3N_4$) maybe formed by plasma CVD method. Note that a silicon nitride ($Si_3N_4$) film formed by plasma CVD method has more hydrogen content than that of a silicon nitride ($Si_3N_4$) film formed by LPCVD method. As the hydrogen content becomes larger, the tensile stress becomes lower. Thus, it is necessary to reduce the hydrogen content in the silicon nitride ($Si_3N_4$) film formed by plasma CVD method after the film formation. For example, a silicon nitride ($Si_3N_4$) film, formed by plasma CVD method using $SiH_4+NH_3$ (+$N_2$) gas, has compression stress.

Then, UV light is irradiated on the silicon nitride ($Si_3N_4$) film to cut Si—H bonding. In this manner, a silicon nitride ($Si_3N_4$) film having tensile stress can be obtained.

In addition, instead of silicon nitride ($Si_3N_4$), carbon-containing silicon nitride (SiCN), boron-containing silicon nitride (SiBN), or carbon-and-boron-containing silicon nitride (SiBCN) may be used. A carbon-containing silicon nitride (SiCN) film can be formed by plasma CVD method using 3MS (trimethylsilane) gas or 4MS (tetramethylsilane)+$NH_3$+$N_2$+He gas. In addition, a boron-containing silicon nitride (SiBN) film or a carbon-and-boron-containing silicon nitride (SiBCN) film can be formed by plasma CVD method, which adds $B_2H_6$ gas to the above-mentioned gas.

Figure 5:
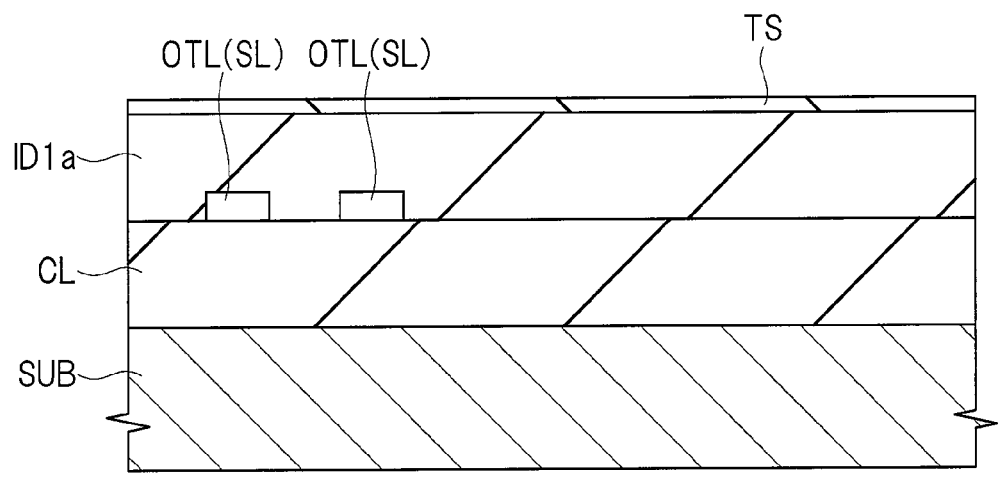
FIG. 5 is a cross-sectional view of main parts illustrating a manufacturing step of the semiconductor device continued from FIG. 4.

Next, as illustrated in FIG. 5, the first rear-surface insulating film RCL and the second rear-surface insulating film RTS are removed by wet etching. Since the second insulating film TS is formed even when the first rear-surface insulating film RCL is removed, compression stress of the first insulating film CL and tensile stress of the second insulating film TS offset each other, thereby reducing warpage of the SOI substrate.

Figure 6:
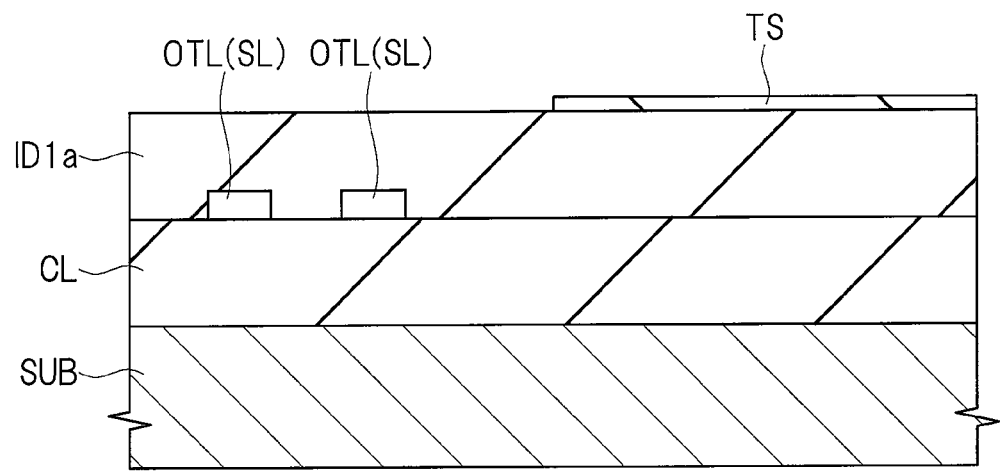
FIG. 6 is a cross-sectional view of main parts illustrating a manufacturing step of the semiconductor device continued from FIG. 5.

Next, as illustrated in FIG. 6, the second insulating film TS positioned above the waveguide OTL is removed by dry etching using a resist pattern formed on the second insulating film TS as a mask. In this case, the second insulating film is removed to have a distance of 2 μm or larger between the waveguide OTL and the second insulating film TS.

Figure 7:
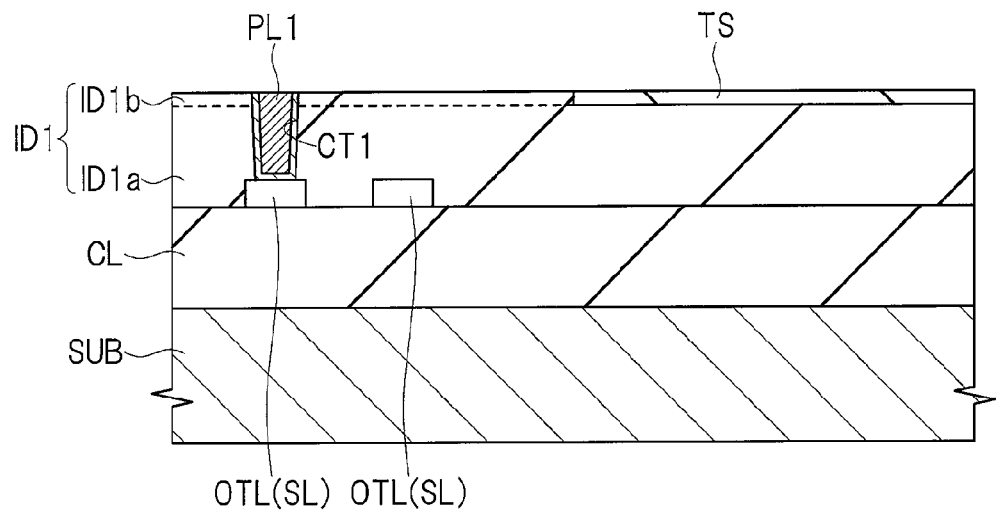
FIG. 7 is a cross-sectional view of main parts illustrating a manufacturing step of the semiconductor device continued from FIG. 6.

Next, as illustrated in FIG. 7, an upper-layer insulating film ID1b made of silicon oxide ($SiO_2$) is formed on the exposed lower insulating film ID1 and on the second insulating film TS by, for example, plasma CVD method.

Subsequently, an upper surface of the upper-layer insulating film ID1b is planarized by, for example, CMP method or the like to expose the second insulating film TS. In this manner, in the region above the waveguide OTL, the first interlayer insulating film ID1, which is made of the lower-layer insulating film ID1a and the upper-layer insulating film ID1b, is formed. In the region other than the region above the waveguide OTL, the second insulating film TS and the first interlayer insulating film ID1 made of the lower-layer insulating film ID1a are formed.

Next, the first connection hole CT1 reaching to the waveguide OTL is formed in the first interlayer insulating film ID1. Subsequently, a conductive film is embedded into the first contact hole CT1 via a barrier metal to form the first plug PL1 whose a main conductive material is the embedded conductive film. The main conductive material of the first plug PL1 is made of, for example, aluminum (Al) or tungsten (W). The barrier metal is made of, for example, titanium (Ti) or titanium nitride (TiN) etc.

Figure 8:
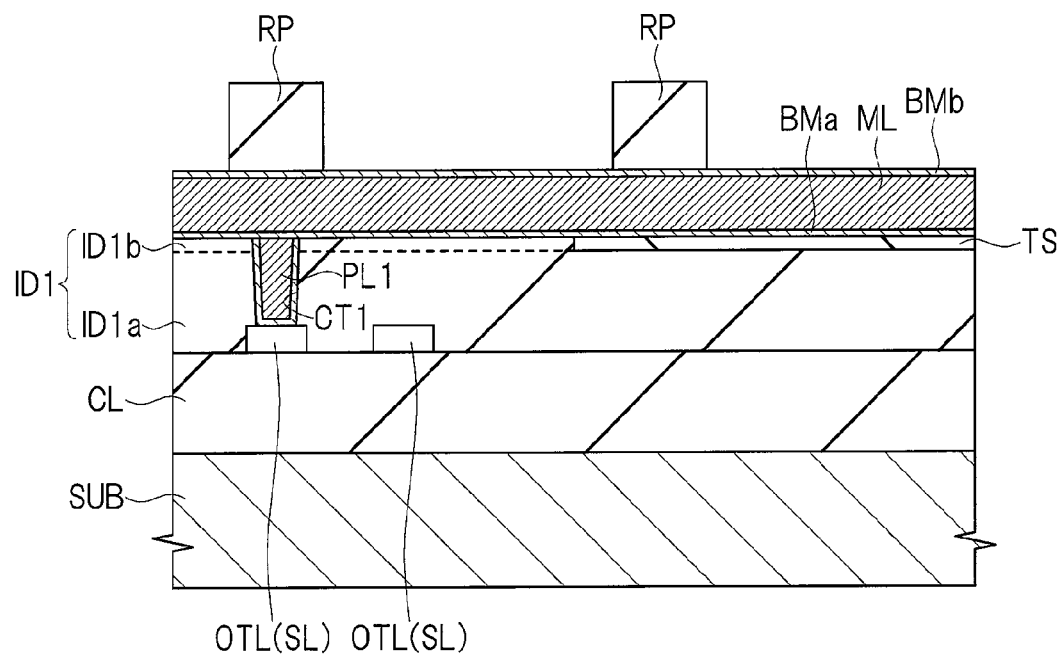
FIG. 8 is a cross-sectional view of main parts illustrating a manufacturing step of the semiconductor device continued from FIG. 7.

Next, as illustrated in FIG. 8, a barrier metal BMa, a metal film (main conductive material) ML, and a barrier metal BMb are sequentially deposited on the first interlayer insulating film ID1 and the second insulating film TS by, for example, a sputtering method. The metal film (main conductive materials) ML is made of, for example, aluminum (Al) and the barrier metals BMa and BMb are made of, for example, tantalum (Ta), titanium (Ti), tantalum nitride (TaN) or titanium nitride (TiN) etc.

Next, photoresist is applied onto the barrier metal BMa, and a resist pattern RP is formed by pattering the photoresist through a development treatment after exposure.

Figure 9:
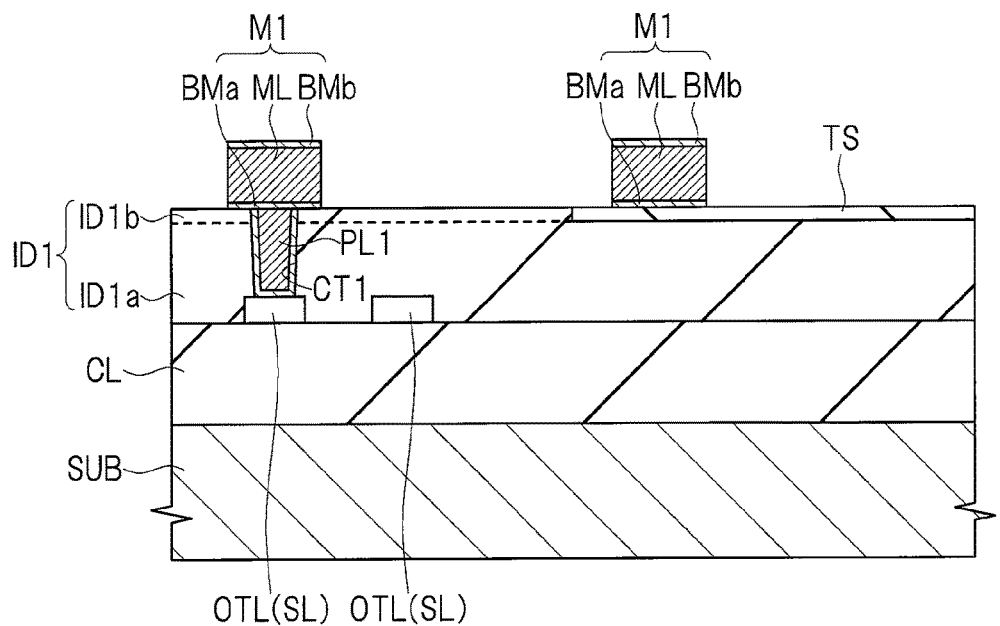
FIG. 9 is a cross-sectional view of main parts illustrating a manufacturing step of the semiconductor device continued from FIG. 8.

Next, as illustrated in FIG. 9, using a plasma etching device, the barrier metal BMa, the metal film (main conductive material) ML, and the barrier metal BMb are processed by dry etching using the resist pattern RP as a mask, thereby forming the wiring M1 of the first layer. Then, the resist pattern RP is removed.

In the plasma etching device, an electrostatic chuck is used for fixing the SOI substrate to a stage of the device. The electrostatic chuck is an electrode plate, made of a conductive metal, to which a desired dielectric having a desired thickness is attached. When the SOI substrate is placed on the electrostatic chuck and a voltage is applied to between the SOI substrate and the electrode plate, electrostatic force is generated, so that the SOI substrate is attracted to, held on, and fixed to the stage.

Meanwhile, as mentioned above, in the case of using an SOI substrate, the SOI substrate is sometimes attached to the electrostatic chuck when residual attracting force of the electrostatic chuck is not reduced due to charges remained in the SOI substrate. Thus, when the SOI substrate is detached from the electrostatic chuck, cracking or conveyance failure of the SOI substrate may occur. Particularly, in the case of the SOI substrate, the residual attracting force increases when an insulating film (e.g., the first rear-surface insulating film RCL) is formed on the rear surface of the SOI substrate.

However, in the first embodiment, since the first rear-surface insulating film RCL formed on the rear surface of the SOI substrate is removed, it is possible to release charges from the SOI wafer easily. Thus, as such charges are hardly accumulated on the rear surface of the SOI substrate, the residual attracting force of the electrostatic chuck is reduced, so that attachment of the SOI substrate to the electrostatic chuck can be avoided. Further, since the second insulating film TS having tensile stress that can offset compression stress of the first insulating film CL is formed, the compression stress of the first insulating film CL is alleviated, so that warpage of the SOI substrate can be reduced. In this manner, failures such as conveyance failure of the SOI substrate hardly occur when the SOI substrate is detached from the electrostatic chuck.

Figure 10:
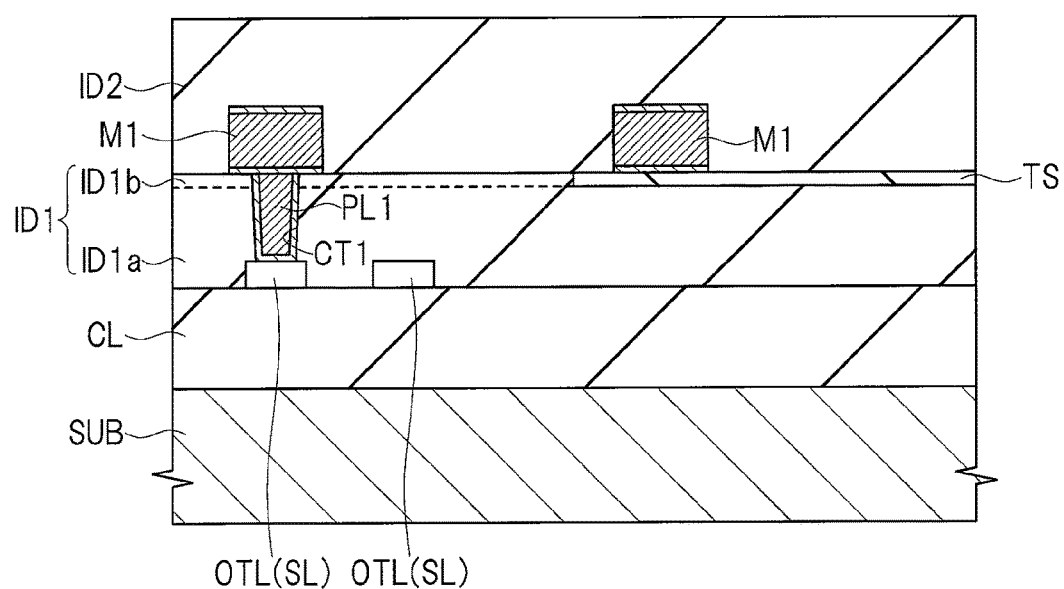
FIG. 10 is a cross-sectional view of main parts illustrating a manufacturing step of the semiconductor device continued from FIG. 9.

Next, as illustrated in FIG. 10, the second interlayer insulating film ID2 is formed on the first interlayer insulating film ID1 and the second insulating film TS so as to cover the wiring M1 of the first layer. The second interlayer insulating film ID2 is, for example, made of silicon oxide ($SiO_2$) formed by plasma CVD method and has a thickness of, for example, equal to or larger than 1 μm.

Next, as illustrated in FIG. 1, an upper surface of the second interlayer insulating film ID2 is planarized by, for example, CMP method, and then the second connection hole CT2 reaching to the wiring M1 of the first layer is formed in the second interlayer insulating film ID2. Subsequently, a conductive film is embedded into the second connection hole CT2 via a barrier metal to form the second plug PL2 whose a main conductive material is the embedded conductive film. The main conductive material of the second plug is, for example, aluminum (Al) or tungsten (W) etc. The barrier metal is made of, for example, titanium (Ti) or titanium nitride (TiN) etc.

Next, a barrier metal, a metal film (main conductive material), and a barrier metal are sequentially deposited on the second interlayer insulating film ID2 by, for example, sputtering method, and the stacked-layer film is processed by dry etching using a resist mask to form the wiring M2 of the second layer. The main conductive material of the wiring M2 of the second layer is made of, for example, aluminum (Al), and the barrier metals are made of, for example, tantalum (Ta), titanium (Ti), tantalum nitride (TaN), or titanium nitride (TiN) etc.

Also in the plasma etching device to be employed in forming of the wiring M2 of the second layer, an electrostatic chuck is used for fixing the SOI substrate to a stage of the device. However, in the same manner as the plasma etching device described above, since the first rear-surface insulating film RCL formed on the rear surface of the SOI substrate is removed, charges are easily released from the SOI substrate. Thus, as such charges are hardly accumulated on the rear surface of the SOI substrate, the residual attracting force of the electrostatic chuck is reduced, so that attachment of the SOI substrate to the electrostatic chuck can be avoided. Further, since the second insulating film TS having tensile stress that can offset compression stress of the first insulating film CL is formed, the compression stress of the first insulating film CL is alleviated, so that warpage of the SOI substrate can be reduced. In this manner, failures such as conveyance failure of the SOI substrate hardly occur when the SOI substrate is detached from the electrostatic chuck. Thereafter, a protective film TC is formed on the second interlayer insulating film ID2 so as to cover the wiring M2 of the second layer, and then the protective film TC is processed to expose an upper surface of the wiring M2 of the second layer. In this manner, the semiconductor device according to the first embodiment is substantially completed.

While the semiconductor device including an optical-signal waveguide has been exemplified in FIG. 1 as an example of the first embodiment, the present invention is not limited to this structure.

Figure 11:
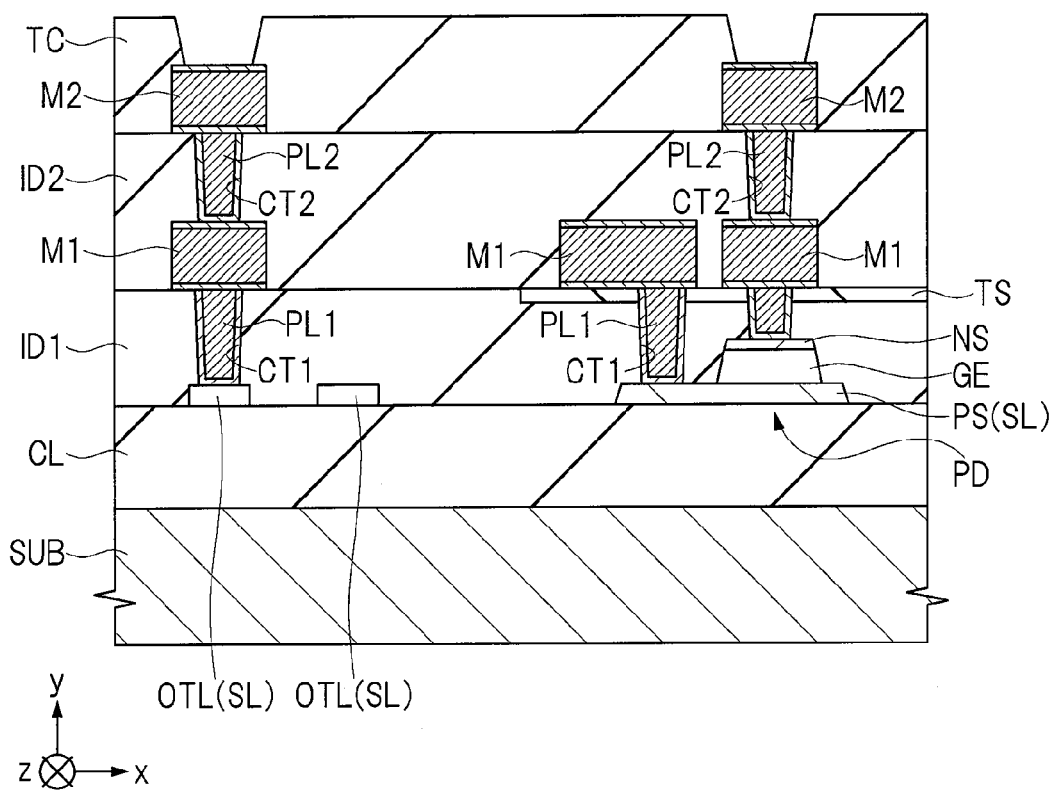
FIG. 11 is a cross-sectional view of main parts of the semiconductor device according to a second modification example of the first embodiment.

FIG. 11 is a cross-sectional view of main parts of the semiconductor device according to a second modification example of the first embodiment. The semiconductor device illustrated in FIG. 11 includes a photoreceiver PD made of germanium (Ge) in addition to the optical-signal waveguide OTL. Since germanium (Ge) has a high affinity with silicon (Si), germanium (Ge) can be monolithically formed on the semiconductor layer SL made of silicon (Si).

The photoreceiver PD has, for example, a vertical PIN structure, including a P-type layer PS formed by introducing a p-type impurity into the semiconductor layer SL, a germanium layer GE formed on the P-type layer PS, and an N-type layer NS formed on the germanium layer GE. The N-type layer NS is made of, for example, silicon-germanium (SiGe) and an n-type impurity is introduced thereinto.

The P-type layer PS is electrically connected to the wiring M1 of the first layer via the first connection hole CT1, which is formed to penetrate through the first interlayer insulating film ID1 and the second insulating film TS. In the same manner, the N-type layer NS is electrically connected to the wiring M1 of the first layer via the first connection hole CT1, which is formed to penetrate through the first interlayer insulating film ID1 and the second insulating film TS. Since a propagation loss of light in the waveguide OTL is not caused in the photoreceiver PD, an upper side of the photoreceiver PD can be covered by the second insulating film TS. Therefore, even when the photoreceiver PD is formed, the covering area of the second insulating film TS is not decreased, and thus the effect of offsetting the compression stress of the first insulating film CL is not reduced.

In this manner, according to the first embodiment, even when the semiconductor manufacturing device including an electrostatic chuck is used, attachment of an SOI wafer to the electrostatic chuck can be avoided. Moreover, since warpage of the SOI substrate can be reduced, failures such as conveyance failure of the SOI substrate hardly occur when the SOI substrate is detached from the electrostatic chuck.

(Second Embodiment)

A difference between a second embodiment and the first embodiment described above is the position where the second insulating film TS is provided. The difference will be mainly described hereafter.

<Structure of Semiconductor Device>

Figure 12:
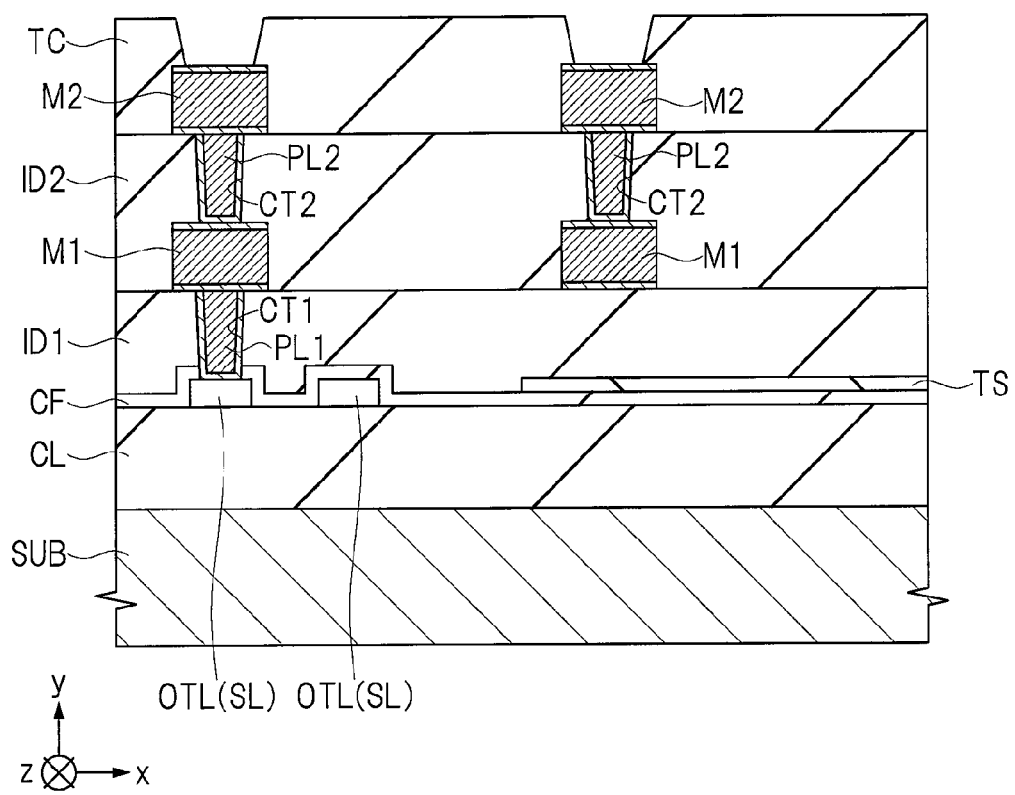
FIG. 12 is a cross-sectional view of main parts of a semiconductor device according to a second embodiment.

The structure of a semiconductor device according to the second embodiment will be described with reference to FIG. 12. FIG. 12 is a cross-sectional view of main parts of the semiconductor device according to the second embodiment.

As illustrated in FIG. 12, in the same manner as the first embodiment, an optical-signal waveguide OTL is formed in the semiconductor device. The waveguide OTL includes a semiconductor layer SL made of silicon (Si), and formed on a first main surface of a semiconductor substrate SUB made of single crystal silicon (Si) interposing a first insulating film CL therebetween.

In the second embodiment, a third insulating film CF is formed on the first insulating film CL so as to cover the waveguide OTL. The third insulating film CF is made of, for example, silicon oxide ($SiO_2$) formed by, for example, a LPCVD method, and has a thickness of, for example, about 50 to 300 nm.

The second insulating film TS having material quality whose compression stress is higher than silicon (Si) is formed on the third insulating film CF. The second insulating film TS is, for example, a silicon nitride ($Si_3N_4$) film or the like, having a hydrogen content of, for example, 1% or lower. The second insulating film TS is formed by, for example, LPCVD method or plasma CVD method. A thickness of the second insulating film TS is, for example, about 100 to 200 nm.

The second insulating film TS is not formed immediately above or on the waveguide OTL, but formed in a region having a predetermined distance from the waveguide OTL, that is, in the region having a distance of, for example, 2 μm or larger therefrom.

The exposed third insulating film CF and the second insulating film TS are covered by the first interlayer insulating film ID1. The first interlayer insulating film ID1 is made of, for example, silicon oxide ($SiO_2$) and has a thickness of, for example, 1 μm or larger, and more preferably about 2 μm.

The wiring M1 of the first layer is formed on the first interlayer insulating film ID1. The waveguide OTL and the wiring M1 of the first layer are electrically connected with each other via the first plug PL1 embedded in the first connection hole CT1, which is formed to penetrate through the first interlayer insulating film ID1 and the third insulating film CF.

In addition, the wiring M1 of the first layer is covered by the second interlayer insulating film ID2. The second interlayer insulating film ID2 is made of, for example, silicon oxide ($SiO_2$) and has a thickness of, for example, 1 μm or larger.

The wiring M2 of the second layer is formed on the second interlayer insulating film ID2. The wiring M1 of the first layer and the wiring M2 of the second layer are electrically connected with each other via the second plug PL2 embedded in the second connection hole CT2, which is formed in the second interlayer insulating film ID2.

Moreover, the wiring M2 of the second layer is covered by the protective film TC, part of which has an opening part to expose an upper surface of the wiring M2 of the second layer.

<Characteristics and Effects in Structure of Semiconductor Device>

While the second insulating film TS is provided between the first interlayer insulating film ID1 and the second interlayer insulating film ID2 in the semiconductor device according to the first embodiment, the second insulating film TS is formed in a lower part of the first interlayer insulating film ID1 in the semiconductor device according to the second embodiment.

Accordingly, it is possible to remove the first rear-surface insulating film RCL (see FIG. 3) at an earlier step than the one in the first embodiment, although the details will be described in the description in the method of manufacturing the semiconductor device. Thus, for example, even when a semiconductor manufacturing device using an electrostatic chuck is used in the formation step of the first interlayer insulating film ID1 by plasma CVD method or, in the processing step of the first connection hole CT1 by plasma etching method, warpage of an SOI substrate is reduced. As a result, failures such as conveyance failure of the SOI substrate can be avoided when the SOI substrate is detached from the electrostatic chuck.

In addition, while the formation step of the upper-layer insulating film ID1b and the planarizing step of the same are required after the second insulating film TS is formed in the first embodiment described above (see FIG. 7), the formation step of the upper-layer insulating film ID1b and the planarizing step of the same are not required in the second embodiment, thereby making it possible to shorten the manufacturing process of the semiconductor device and readily perform the same.

<Method of Manufacturing Semiconductor Device>

A method of manufacturing the semiconductor device according to the second embodiment will be described in order of steps with reference to FIGS. 13 to 18. FIGS. 13 to 18 are cross-sectional views of main parts illustrating manufacturing steps of the semiconductor device according to the second embodiment.

Figure 13:
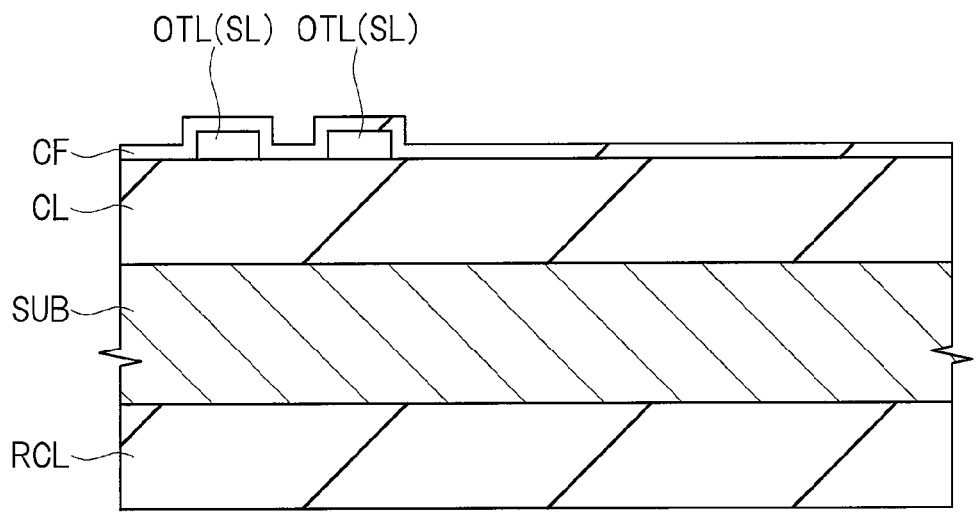
FIG. 13 is a cross-sectional view of main parts illustrating a manufacturing step of the semiconductor device according to the second embodiment.

First, as illustrated in FIG. 13, in the same manner as the first embodiment, an SOI substrate is prepared. The SOI substrate includes the semiconductor substrate SUB, the first insulating film CL formed on the first main surface of the semiconductor substrate SUB, the semiconductor layer SL formed on the first insulating film CL, and a first rear-surface insulating film RCL formed on the second main surface opposite to the first main surface of the semiconductor substrate SUB.

Next, by dry etching using a resist pattern formed on the semiconductor layer SL as a mask, impurities are introduced into the rectangular semiconductor layer SL after the semiconductor layer SL is processed in a rectangular shape. A concentration of the impurities is in a range of, for example, $10^{15}$ to $10^{19}$ cm$^{-3}$ and a typical value of the concentration is, for example, about $10^{15}$ cm$^-$. According to the steps described above, the waveguide OTL is formed.

Next, the third insulating film CF is formed on the first insulating film CL so as to cover the waveguide OTL. The third insulating film CF is made of silicon oxide ($SiO_2$) formed by, for example, LPCVD method, and has a thickness of, for example, about 50 to 300 nm. The third insulating film CF may be a TEOS (tetra ethyl ortho silicate: $Si(OC_2H_5)_4$) oxide film formed by using TEOS and ozone ($O_3$) as source gas.

Figure 14:
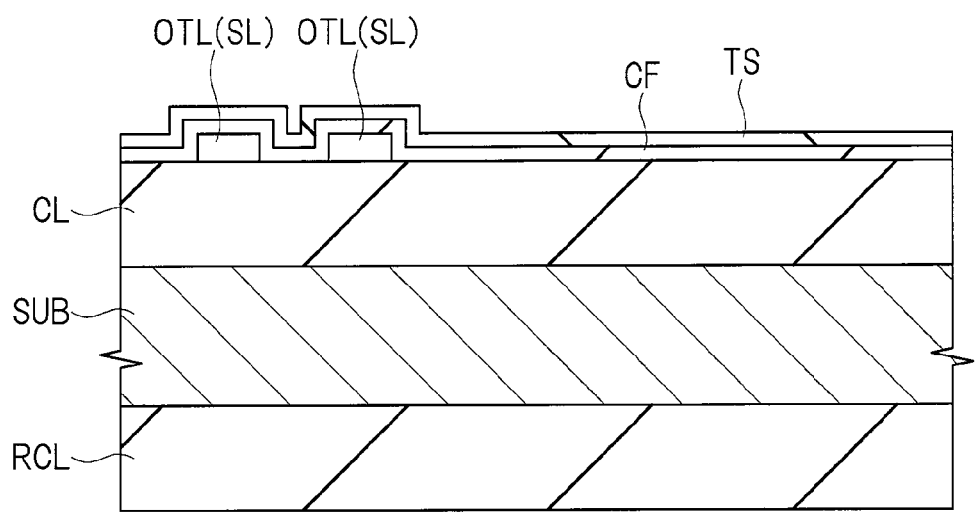
FIG. 14 is a cross-sectional view of main parts illustrating a manufacturing step of the semiconductor device continued from FIG. 13.

Next, as illustrated in FIG. 14, the second insulating film TS made of silicon nitride ($Si_3N_4$) is formed on the third insulating film CF by, for example, LPCVD method. A thickness of the second insulating film TS is, for example, about 100 to 200 nm. A hydrogen content of the second insulating film TS is equal to or lower than 1%. The second insulating film TS has tensile stress.

Although silicon nitride ($Si_3N_4$) formed by LPCVD method has been exemplified as the second insulating film TS having tensile stress in this embodiment, the present embodiment is not limited to this example. In the same manner as the first embodiment, instead of using LPCVD method, silicon nitride ($Si_3N_4$) may be formed by plasma CVD method. In addition, instead of silicon nitride ($Si_3N_4$), carbon-containing silicon nitride (SiCN), boron-containing silicon nitride (SiBN), or carbon-and-boron-containing silicon nitride (SiBCN) may be used.

Figure 15:
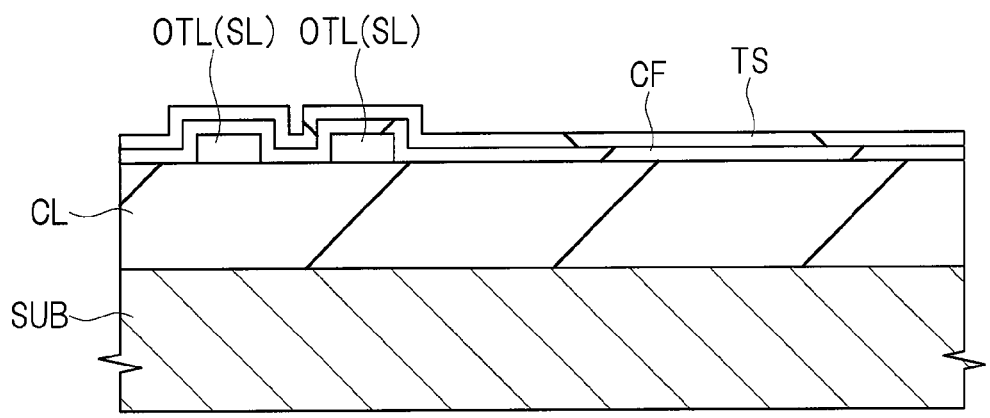
FIG. 15 is a cross-sectional view of main parts illustrating a manufacturing step of the semiconductor device continued from FIG. 14.

Next, as illustrated in FIG. 15, the first rear-surface insulating film RCL is removed by wet etching. Since the second insulating film TS is formed even when the first rear-surface insulating film RCL is removed, compression stress of the first insulating film CL and tensile stress of the second insulating film TS offset each other, thereby reducing warpage of the SOI substrate.

Figure 16:
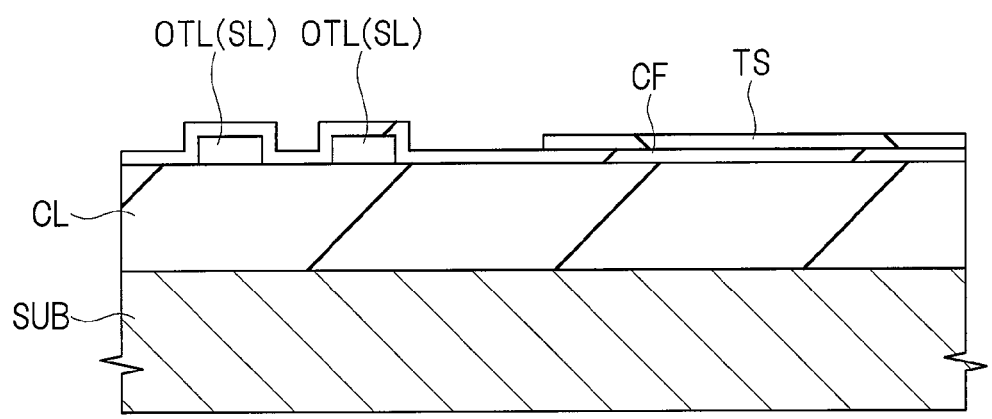
FIG. 16 is a cross-sectional view of main parts illustrating a manufacturing step of the semiconductor device continued from FIG. 15.

Next, as illustrated in FIG. 16, the second insulating film TS positioned above the waveguide OTL is removed by dry etching using a resist pattern formed on the second insulating film TS as a mask. In this case, the second insulating film TS is removed to have a distance of 2 μm or larger between the waveguide OTL and the second insulating film TS.

Figure 17:
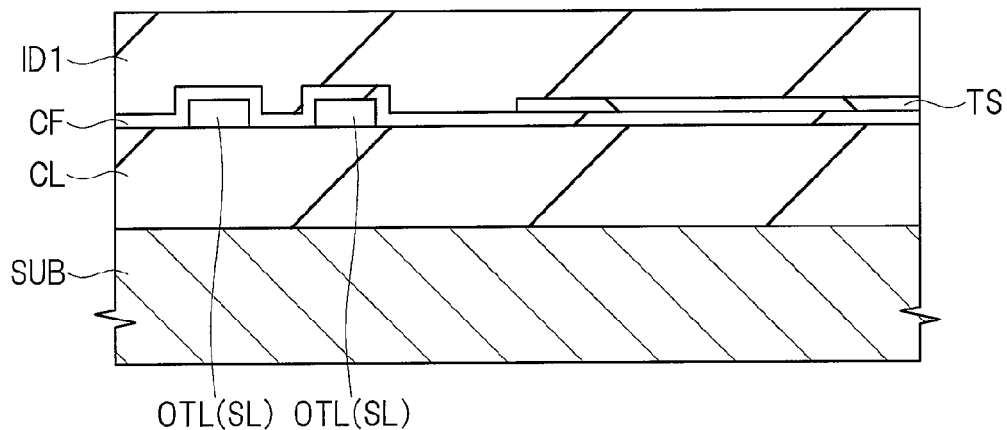
FIG. 17 is a cross-sectional view of main parts illustrating a manufacturing step of the semiconductor device continued from FIG. 16.

Next, as illustrated in FIG. 17, the first interlayer insulating film ID1 made of silicon oxide ($SiO_2$) is formed on the exposed third insulating film CF and the second insulating film TS by a SACVD (sub-atmospheric chemical vapor deposition: sub-atmospheric CVD) method. The first interlayer insulating film ID1 may be a TEOS oxide film using TEOS and ozone as source gas. Here, the first interlayer insulating film ID1 may be formed by using a plasma CVD device including an electrostatic chuck. As the first rear-surface insulating film RCL is already removed and the second insulating film TS having the effect of offsetting compression stress of the first insulating film CL is formed, failures such as conveyance failure of the SOI substrate can be avoided.

Subsequently, after the first interlayer insulating film ID1 is sintered by a thermal treatment, an upper surface of the first interlayer insulating film ID1 is planarized by, for example, CMP method.

Figure 18:
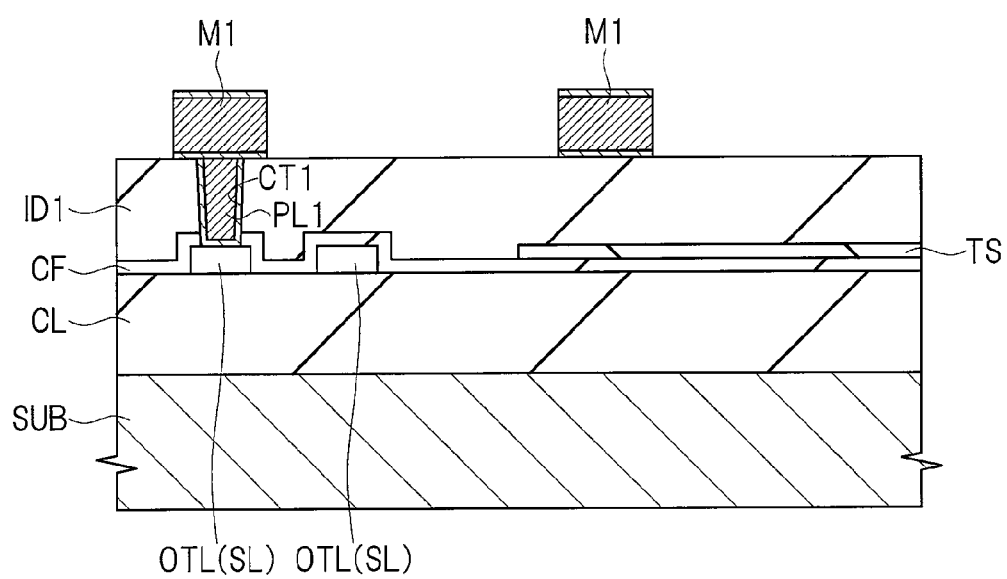
FIG. 18 is a cross-sectional view of main parts illustrating a manufacturing step of the semiconductor device continued from FIG. 17.

Next, as illustrated in FIG. 18, the first connection hole CT1 reaching to the waveguide OTL by penetrating through the first interlayer insulating film ID1 and the second interlayer insulating film ID2 is formed. Here, the first connection hole CT1 maybe formed by using a plasma dry etching device including an electrostatic chuck. As the first rear-surface insulating film RCL is already removed and the second insulating film TS having the effect of offsetting compression stress of the first insulating film CL is formed, failures such as conveyance failure of the SOI substrate can be avoided.

Next, in the same manner as the first embodiment, after the first plug PL1 inside the first connection hole CT1 is formed via a barrier metal, the wiring M1 of the first layer electrically connected to the first plug PL1 is formed.

Then, the second interlayer insulating film ID2, the second connection hole PL2, the wiring M2 of the second layer, and the protective film TC are formed, and the semiconductor device according to the second embodiment is substantially completed, as illustrated in FIG. 12.

In this manner, according to the second embodiment, in the same manner as the first embodiment, attachment of an SOI substrate to an electrostatic chuck can be avoided even when a semiconductor manufacturing device including an electrostatic chuck is used. Furthermore, since warpage of an SOI substrate can be reduced, failures such as conveyance failure of the SOI substrate hardly occur when the SOI substrate is detached from the electrostatic chuck.

In the foregoing, the invention made by the inventor of the present invention has been concretely described based on the embodiments. However, it is needless to say that the present invention is not limited to the foregoing embodiments and various modifications and alterations can be made within the scope of the present invention.

The invention claimed is:

1. A semiconductor device comprising:
   a substrate made of silicon;
   a first clad layer formed on a main surface of the substrate and configured to generate compression stress to silicon;
   an optical waveguide, made of silicon, formed on the first clad layer; and
   a second clad layer formed on the first clad layer so as to cover the optical waveguide,
   wherein an insulating film configured to generate tensile stress to silicon is formed on the second clad layer, or below the second clad layer, and in a region distant from the optical waveguide by a thickness of the first clad layer or larger.

2. The semiconductor device according to claim 1,
   wherein the first clad layer and the second clad layer are made of silicon oxide, and
   the insulating film is made of silicon nitride, carbon-containing silicon nitride, boron-containing silicon nitride, or carbon-and-boron-containing silicon nitride.

3. The semiconductor device according to claim 2,
   wherein a hydrogen content of the insulating film is equal to or lower than 1%.

4. The semiconductor device according to claim 1,
   wherein a thickness of the insulating film is 100 to 200 nm.

* * * * *